(12) United States Patent
Byeon

(10) Patent No.: US 7,965,573 B2
(45) Date of Patent: Jun. 21, 2011

(54) POWER-UP SIGNAL GENERATOR FOR USE IN SEMICONDUCTOR DEVICE

(75) Inventor: Sang-Jin Byeon, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1207 days.

(21) Appl. No.: 11/646,415

(22) Filed: Dec. 28, 2006

(65) Prior Publication Data

US 2007/0280024 A1    Dec. 6, 2007

(30) Foreign Application Priority Data

May 31, 2006  (KR) .................. 10-2006-0049130

(51) Int. Cl.
*G11C 5/14* (2006.01)
(52) U.S. Cl. ................... 365/226; 365/227; 365/189.09; 365/189.02
(58) Field of Classification Search .................. 365/226, 365/227, 189.09, 189.02
See application file for complete search history.

(56) References Cited

U.S. PATENT DOCUMENTS

| 6,097,659 | A | 8/2000 | Kang |
| 6,845,048 | B2 * | 1/2005 | Alexander et al. ....... 365/189.02 |
| 6,885,605 | B2 | 4/2005 | Lee et al. |
| 6,937,074 | B2 | 8/2005 | Shin |
| 2005/0135174 | A1 | 6/2005 | Lee et al. |
| 2007/0195630 | A1 * | 8/2007 | Hwang et al. ................. 365/226 |

FOREIGN PATENT DOCUMENTS

| JP | 2003-203479 | 7/2003 |
| KR | 10-2000-0028397 | 5/2000 |
| KR | 10-2002-0049207 | 6/2002 |
| KR | 10-2003-0034461 | 5/2003 |
| KR | 10-2003-0089878 | 11/2003 |
| KR | 10-2006-0054612 | 5/2006 |

* cited by examiner

Primary Examiner — Vu A Le
Assistant Examiner — Han Yang
(74) Attorney, Agent, or Firm — IP & T Group LLP

(57) ABSTRACT

In an apparatus for generating a power-up signal, a mode register set (MRS) and other circuits are prevented from being reset, thereby providing stable circuit operation. A final power-up signal is not disabled even though an internal voltage generating unit is turned off at a test mode. The apparatus includes a power-up signal generator for producing a power-up signal; a multiplexing unit for selectively outputting the power-up signal or a static voltage signal in a test mode; and a power-up signal generator for producing a final power-up signal in response to the power-up signal of the power-up signal generator and an output signal of the multiplexing unit as the final power-up signal.

8 Claims, 4 Drawing Sheets

POWER-UP SIGNAL GENERATOR FOR USE IN SEMICONDUCTOR DEVICE

CROSS-REFERENCE TO RELATED APPLICATION

The present invention claims priority of Korean patent application number 10-2006-0049130, filed on May 31, 2006, which is incorporated by reference in its entirety.

BACKGROUND OF THE INVENTION

The present invention relates to a semiconductor design technology; and, more particularly, to a power-up signal generator of a semiconductor device.

Generally, a semiconductor device does not operate in response to an external power voltage VDD immediately after it is input therein, but operates after the input external power voltage VDD rises to a predetermined voltage level. By reason of this, most semiconductor devices should have a power-up signal generator.

In the case where an internal circuit operates after the external power voltage VDD is applied to the semiconductor device and before the external power voltage VDD reaches a predetermined voltage level, the semiconductor device can be destroyed due to the latch-up. The power-up signal generating unit outputs, for example, a power-up signal in a logic low level until the external power voltage VDD reaches a predetermined voltage level after being input, and outputs the power-up signal in a logic high level when the external power voltage VDD is stabilized over the predetermined voltage level. The internal circuit performs the stable operation in response to the power-up signal.

On the other hand, a semiconductor device, such as a DRAM, has internal power voltages which are required by each of its internal circuits. For example, the internal power voltage may be a core voltage VCORE or a pumping voltage VPP. For the core voltage VCORE and the pumping voltage VPP, it is necessary to have the individual power-up signals. A final power-up signal is produced by summing up the power-up signals which are individually created for the individual internal voltages. In this case, the semiconductor device can produce the power-up signal by considering not only the external power voltage VDD but also the states of the internal power voltages. As a result, the stability of the semiconductor device considering the external power voltage VDD and the internal power voltage may be improved, as compared with that considering only the external power voltage VDD.

FIG. 1 is a block diagram illustrating conventional internal voltage generating units and power-up signal generating units. In FIG. 1, a stabilization power-up signal generating unit 100 to which an external power voltage VDD is input produces a stabilization power-up signal PWRUP_T. A precharge power-up signal generating unit 110 to which the external power voltage VDD is input produces a precharge power-up signal PWRUP_PRE and an external voltage power-up signal generating unit 120 to which the external power voltage VDD is input produces an external voltage power-up signal PWRUP_VDD. A pumping voltage generating unit 130 to which the precharge power-up signal PWRUP_PRE is input produces a pumping voltage VPP and the pumping voltage generating unit 130 is turned off in response to a pumping voltage off signal TVPPOFF at the time of test. A core voltage generating unit 140 to which the precharge power-up signal PWRUP_PRE is input produces a core voltage VCORE and the core voltage generating unit 140 is turned off in response to a core voltage off signal TVCOREOFF at the time of test. A pumping voltage power-up signal generating unit 150 receives the pumping voltage VPP and produces a pumping voltage power-up signal PWRUP_VPP. A core voltage power-up signal generating unit 160 receives the core voltage VCORE and produces a core voltage power-up signal PWRUP_VCORE. A final power-up signal generating unit 170 receives the external voltage power-up signal PWRUP_VDD, the stabilization power-up signal PWRUP_T, the pumping voltage power-up signal PWRUP_VPP and the core voltage power-up signal PWRUP_VCORE and produces a final power-up signal PWRUP.

If the external power voltage VDD is input and increasingly rises, the stabilization power-up signal PWRUP_T generated in the stabilization power-up signal generating unit 100 is input into the final power-up signal generating unit 170. The stabilization power-up signal PWRUP_T, as a signal which is input into the final power-up signal generating unit 170 faster than the external voltage power-up signal PWRUP_VDD, prevents the final power-up signal PWRUP from being reset although the external voltage power-up signal PWRUP_VDD is turned off. Thereafter, if the voltage level of the external power voltage VDD is able to provide the internal voltage VPP and VCORE, the precharge power-up signal generating unit 110 produces the precharge power-up signal PWRUP_PRE. The pumping voltage generation unit 130 and the core voltage generating unit 140 receives this precharge power-up signal PWRUP_PRE and generate the pumping voltage VPP and the core voltage VCORE, respectively.

If the external power voltage VDD gets to a voltage level enough to stably operate the internal circuits, the external voltage power-up signal generating unit 120 produces the external voltage power-up signal PWRUP_VDD and inputs it to the final power-up signal generating unit 170. Thereafter, if the pumping voltage power-up signal generating unit 150 and the core voltage power-up signal generating unit 160, each of which receives the pumping voltage VPP and the core voltage VCORE, also get to a voltage level enough to stably operate the internal circuits, respectively, the pumping voltage power-up signal generating unit 160 produces the pumping voltage power-up signal PWRUP_VPP and the core voltage power-up signal generating unit 160 produces the core voltage power-up signal PWRUP_VCORE.

The final power-up signal generating unit 170, which receives these power-up signals, produces the final power-up signal PWRUP after confirming that the stable voltage levels are secured for the circuit operation.

FIG. 2 is a circuit diagram illustrating the power-up signal generating unit for the external power voltage in FIG. 1. Referring to FIG. 2, the external voltage power-up signal generating unit 120 includes a voltage divider 200, NMOS transistors N21 and N22, PMOS transistor P21 and a driver 210. The voltage divider 200 includes resistors R21 and R22, which are connected in series between a power supply terminal to receive the external power voltage and a ground voltage terminal VSS, for distributing a divided voltage. The NMOS transistor N21 has a gate and a source which are commonly connected to node "A" between two resistors R21 and R22 and the NMOS transistor N21 controls a voltage level which is applied to the NMOS transistor N22. The PMOS transistor P21 is disposed between the power supply terminal and the ground voltage terminal VSS and has a gate which is connected to the ground voltage terminal VSS. The NMOS transistor N22 is disposed between the PMOS transistor P21 and the ground voltage terminal VSS and has a gate which is connected to node "A." The driver 210, which receives an output signal DET produced by the PMOS transistor P21 and the NMOS transistor N22, drives the external voltage power-up signal PWRUP_VDD.

The driver 210 can include a PMOS transistor P22, which is formed between the power supply terminal and the ground voltage terminal VSS and has a gate to which the output signal DET is applied, and an NMOS transistor N23, which is formed between the PMOS transistor P22 and the ground voltage terminal VSS and has a gate to which the output signal DET is applied.

The external voltage power-up signal PWRUP_VDD is output in a logic low level when the NMOS transistor N23 of the driver 210 is turned on by the output signal DET which is output in a logic high level by the PMOS transistor P21. As the external power voltage VDD gradually increases, a divided voltage is produced at node "A" of the voltage divider 200 to divide the external power voltage VDD. The more the external power voltage VDD increases, the higher the divided voltage at node "A" becomes. This increased divided voltage turns on the NMOS transistor N22. Accordingly, the output signal DET input to the driver 210 turns on the PMOS transistor P22 and then the external voltage power-up signal PWRUP_VDD goes from a logic low level to a logic high level. That is, the external power supply power-up signal PWRUP_VDD transitions from a logic low level to a logic high level at the point of time when the external power voltage VDD has a desired voltage level.

FIG. 3 is a circuit diagram illustrating the power-up signal generating unit for a pumping voltage in FIG. 1. The pumping voltage power-up signal generating unit 150 has a configuration which is similar to the external voltage power-up signal generating unit 120 of FIG. 2. However, instead of the power supply voltage VDD applied to the voltage divider 200 of FIG. 2, the pumping voltage VPP generated by the pumping voltage generating unit 130 in FIG. 1 is applied to the pumping voltage power-up signal generating unit 150.

Referring to FIG. 3, the pumping voltage power-up signal generating unit 150 includes a voltage divider 300, NMOS transistors N31 and N32, PMOS transistor P31 and a driver 310. The voltage divider 300 includes resistors R31 and R32, which are connected in series between a power supply terminal to receive the pumping voltage VPP and a ground voltage terminal VSS, for distributing a divided voltage. The NMOS transistor N31 has a gate and a source which are commonly connected to node "B" between two resistors R31 and R32 and the NMOS transistor N31 controls a voltage level which is applied to the NMOS transistor N32. The PMOS transistor P31 is disposed between the power supply terminal and the ground voltage terminal VSS and has a gate which is connected to the ground voltage terminal VSS. The NMOS transistor N32 is disposed between the PMOS transistor P31 and the ground voltage terminal VSS and has a gate which is connected to node "B." The driver 310, which receives an output signal DET produced by the PMOS transistor P31 and the NMOS transistor N32, drives the pumping voltage power-up signal PWRUP_VPP.

The driver 310 can include a PMOS transistor P32, which is formed between the power supply terminal and the ground voltage terminal VSS and has a gate to which the output signal DET is applied, and an NMOS transistor N33, which is formed between the PMOS transistor P32 and the ground voltage terminal VSS and has a gate to which the output signal DET is applied.

The pumping voltage power-up signal PWRUP_VPP is output in a logic low level when the NMOS transistor N33 of the driver 310 is turned on by the output signal DET which is output in a logic high level by the PMOS transistor P31. As the pumping voltage VPP gradually increases, the divided voltage is produced at node "B" of the voltage divider 300 to divide the pumping voltage VPP. The more the pumping voltage VPP increases, the higher the divided voltage at node "B" becomes. This increased divided voltage turns on the NMOS transistor N32. Accordingly, the output signal DET input to the driver 310 turns on the PMOS transistor P32 and then the pumping voltage power-up signal PWRUP_VPP goes from a logic low level to a logic high level.

That is, the pumping power supply power-up signal PWRUP_VPP transitions from a logic low level to a logic high level at the point of time when the pumping power voltage VPP has a desired voltage level.

FIG. 4 is a circuit diagram illustrating the power-up signal generating unit for a core voltage in FIG. 1. The core voltage power-up signal generating unit 160 has a configuration which is similar to the external voltage power-up signal generating unit 120 of FIG. 2. However, instead of the power supply voltage VDD applied to the voltage divider 200 of FIG. 2, the core voltage VCORE generated by the core voltage generating unit 140 in FIG. 1 is applied to the core voltage power-up signal generating unit 160.

Referring to FIG. 4, the core voltage power-up signal generating unit 160 includes a voltage divider 400, NMOS transistors N41 and N42, PMOS transistor P41 and a driver 410. The voltage divider 400 includes resistors R41 and R42, which are in series connected between a power supply terminal to receive the core voltage and a ground voltage terminal VSS, for distributing a divided voltage. The NMOS transistor N41 has a gate and a source which are commonly connected to node "C" between two resistors R41 and R42 and the NMOS transistor N41 controls a voltage level which is applied to the NMOS transistor N42. The PMOS transistor P41 is disposed between the power supply terminal and the ground voltage terminal VSS and has a gate which is connected to the ground voltage terminal VSS. The NMOS transistor N42 is disposed between the PMOS transistor P41 and the ground voltage terminal VSS and has a gate which is connected to node "C." The driver 410, which receives an output signal DET produced by the PMOS transistor P41 and the NMOS transistor N42, drives the core voltage power-up signal PWRUP_VCORE.

The driver 410 can include a PMOS transistor P42, which is formed between the power supply terminal and the ground voltage terminal VSS and has a gate to which the output signal DET is applied, and an NMOS transistor N43, which is formed between the PMOS transistor P42 and the ground voltage terminal VSS and has a gate to which the output signal DET is applied.

The core voltage power-up signal PWRUP_VDD is output in a logic low level when the NMOS transistor N43 of the driver 410 is turned on by the output signal DET which is output in a logic high level by the PMOS transistor P41. As the core voltage VCORE gradually increases, the divided voltage is produced at node "C" of the voltage divider 400 to divide the core voltage VCORE. The more the core voltage VCORE increases, the higher the divided voltage at node "C" becomes. This increased divided voltage turns on the NMOS transistor N42. Accordingly, the output signal DET input to the driver 410 turns on the PMOS transistor P42 and then the core voltage power-up signal PWRUP_VCORE goes from a logic low level to a logic high level. That is, the core voltage power-up signal PWRUP_VCORE transitions from a logic low level to a logic high level at the point of time when the core voltage VCORE has a desired voltage level.

FIG. 5 is a circuit diagram illustrating a final power-up signal generating unit in FIG. 1. Referring to FIG. 1, the final power-up signal generating unit 170 includes a PMOS transistor P51, an NMOS transistor N51, a latch unit 500, a NAND gate NAND51 and an inverter INV53. The PMOS transistor P51 is disposed between the power supply terminal to receive the external power voltage VDD and node "D" and has a gate to which the stabilization power-up signal PWRUP_T is applied. The NMOS transistor N51 is disposed between node "D" and the ground voltage terminal and has a gate to which the external voltage power-up signal PWRUP_VDD is applied. The latch unit 500, having two inverters INV51 and INV52, receives the voltage on node "D" and temporarily stores the latched voltage. The NAND gate NAND51 receives an output signal of the latch unit 500, the pumping voltage power-up signal PWRUP_VPP and the core voltage power-up signal PWRUP_VCORE and performs the NAND operation of the received signals. The inverter INV53 inverts an output signal of the NAND gate NAND51 to output the final power-up signal PWRUP.

The input terminal of the latch unit 500 is in a logic high level by turning on the PMOS transistor P51 in response to the stabilization power-up signal PWRUP_T in a logic low level before the external voltage power-up signal PWRUP_VDD is enabled. At this time, the final power-up signal PWRUP is output in a logic low level. Thereafter, when the external voltage power-up signal PWRUP_VDD is in a logic high level, the input terminal of the latch unit 500 is in a logic low level. Since the power-up signal PWRUP_T in a logic high level turns off the PMOS transistor P51, the latched value in the latch unit 500 is maintained even if the external voltage power-up signal PWRUP_VDD goes down to a low voltage due to the unstable external power voltage VDD and then does not turn on the NMOS transistor N51.

Thereafter, the core voltage power-up signal PWRUP_VCORE and the pumping voltage power-up signal PWRUP_VPP transition to a logic high level and the final power-up signal PWRUP then transits to a logic high level. As described above, the conventional final power-up signal generating unit 170 detects the voltage levels of the external power voltage VDD, the core voltage VCORE and the pumping voltage VPP and outputs the final power-up signal PWRUP after confirming each of the individual power-up signals. However, the above-mentioned method has, in a test mode, a problem in the case where the pumping voltage off signal TVPPOFF for turning off the pumping voltage generating unit 130 of FIG. 1 is enabled or the core voltage off signal TVCOREOFF for turning off the core voltage generating unit 140 is enabled. In other words, if one of the pumping voltage off signal TVPPOFF and the core voltage off signal TVCOREOFF is enabled, one of the pumping voltage generating unit 130 and the core voltage generating unit 140 is turned off. Therefore, each of the power-up signal generating units, which respectively receive the core voltage VCORE and the pumping voltage VPP; cannot produce the desired power-up signal. As a result, the case where the final power-up signal PWRUP is disabled can be generated. This can give rise to the serious problem of causing the mode register to set (MRS) and other circuits to reset.

SUMMARY OF THE INVENTION

Embodiments of the present invention are directed to a power-up signal generating unit capable of preventing an undesired transition of a final power-up signal even if each internal power voltage generating unit is turned off at a test mode.

In accordance with an aspect of the present invention, there is provided an apparatus for generating a power-up signal comprising: a plurality of individual power-up signal generation means for detecting voltage levels which are applied to a plurality of voltage terminals and for producing individual power-up signals corresponding to the voltage levels of the voltage terminals, respectively; a multiplexing means for selectively outputting the individual power-up signals corresponding to internal voltage terminals or an alternate signal in response to a test mode internal power off signal to disable an internal power at a test mode, wherein the individual wave power-up signals and the alternate signal produced by the multiplexing means have a constant voltage level; and a final power-up signal generating unit for producing a final power-up signal in response to output signals of the individual power-up signal generation means and the multiplexing means.

In accordance with another aspect of the present invention, there is provided a semiconductor device comprising: an internal power voltage generation means for producing an internal power voltage using an external power voltage under a control of a test mode internal power off signal to disable an internal power at a test mode; a plurality of individual power-up signal generation means for detecting voltage levels of the external power voltage and the internal power voltage and for producing individual power-up signals corresponding to the voltage levels of the external power voltage and the internal power voltage, respectively; a multiplexing means for selectively outputting the individual power-up signals corresponding to the internal power voltage or an alternate signal in response to the test mode internal power off signal; and a final power-up signal generating means for producing a final power-up signal in response to the individual power-up signals corresponding to the internal power voltage and an output signal of the multiplexing means.

In accordance with a further another aspect of the present invention, there is provided an apparatus for generating a power-up signal comprising: a power-up signal generating means for producing a power-up signal; a multiplexing means for selectively outputting the power-up signal or a static voltage signal in a test mode; and a power-up signal generating means for producing a final power-up signal in response to the power-up signal of the power-up signal generating means and an output signal of the multiplexing unit and as the final power-up signal.

DESCRIPTION OF SPECIFIC EMBODIMENTS

According to the present invention, since a final power-up signal is not disabled even though an internal voltage generating unit is turned off at a test mode, it is possible to prevent a mode register set (MRS) and other circuits from being reset with stable circuit operation.

Figure 6:
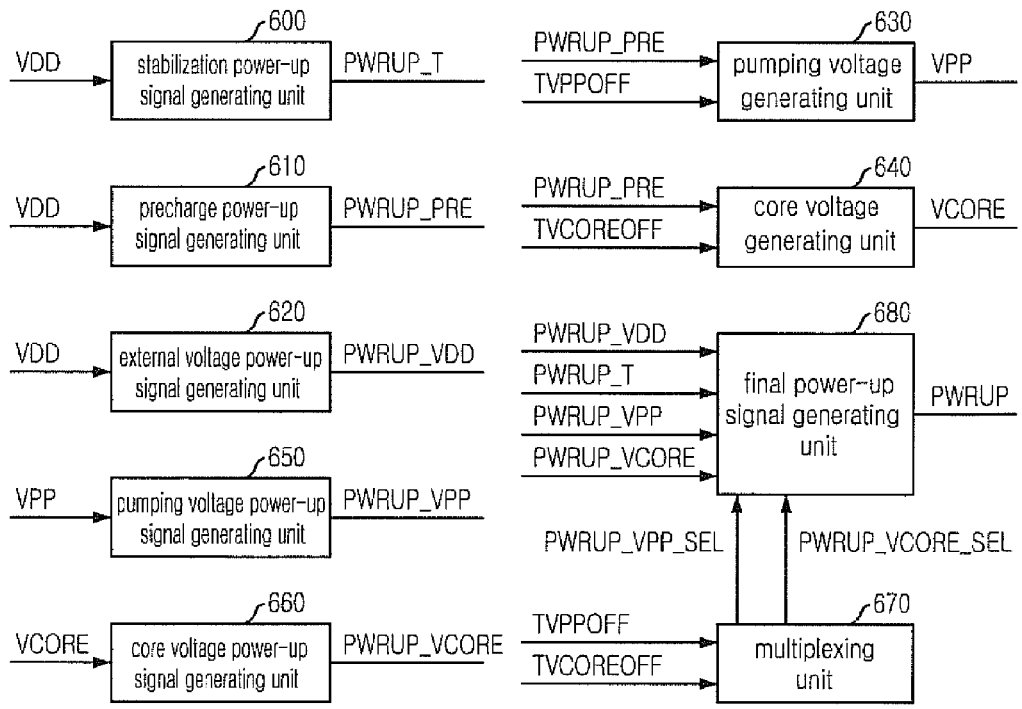
FIG. 6 is a block diagram of voltage generating units and power-up signal generating units according to the present invention.

FIG. 6 is a block diagram of voltage generating units and power-up signal generating units according to the present invention.

Figure 1:
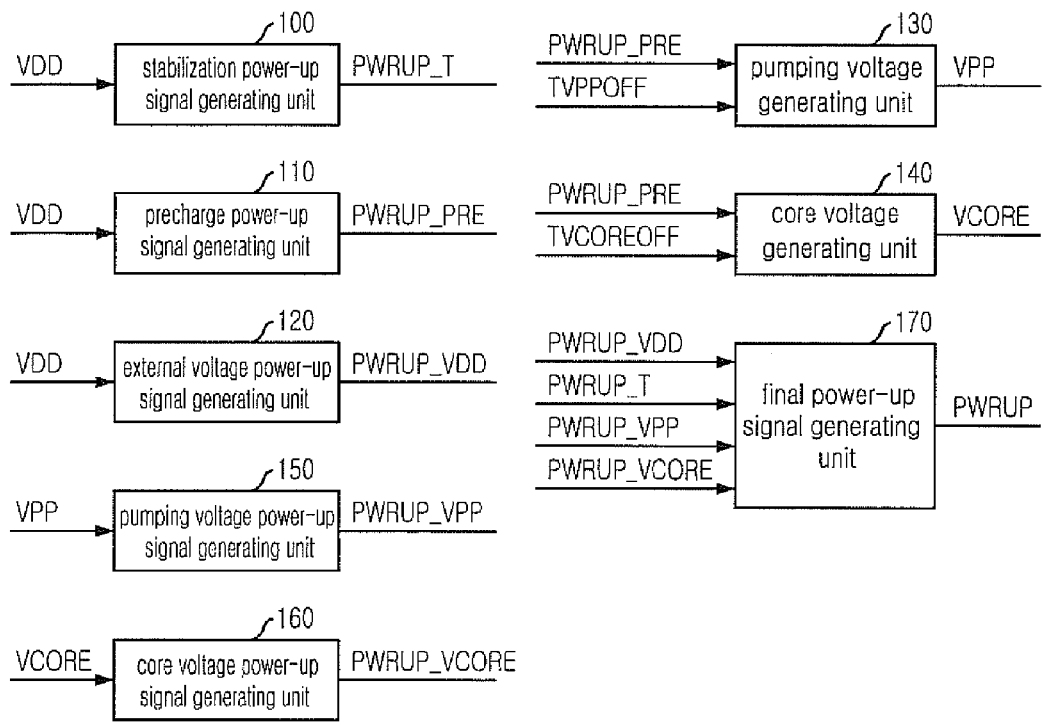
FIG. 1 is a block diagram of conventional internal voltage generating units and power-up signal generating units.
Figure 2:
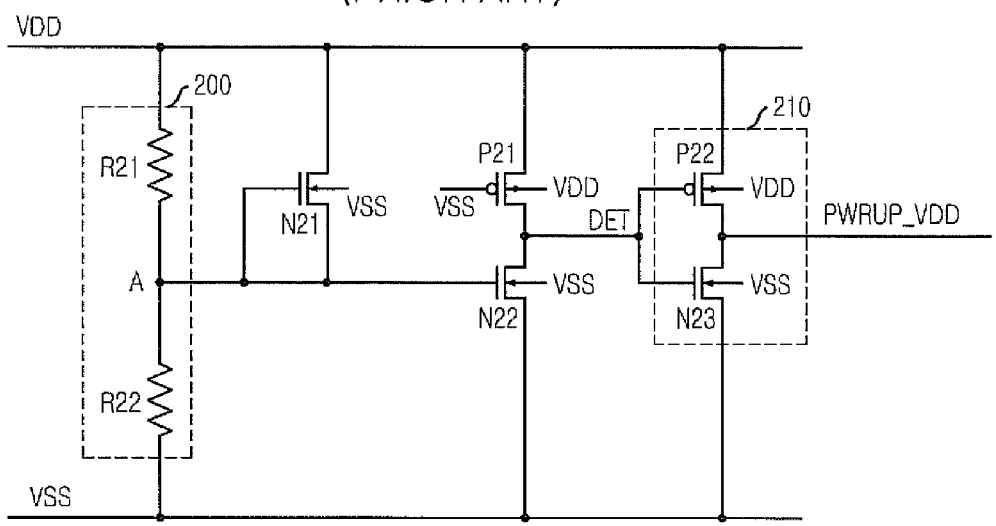
FIG. 2 is a circuit diagram of the power-up signal generating unit for an external power voltage in FIG. 1.
Figure 3:
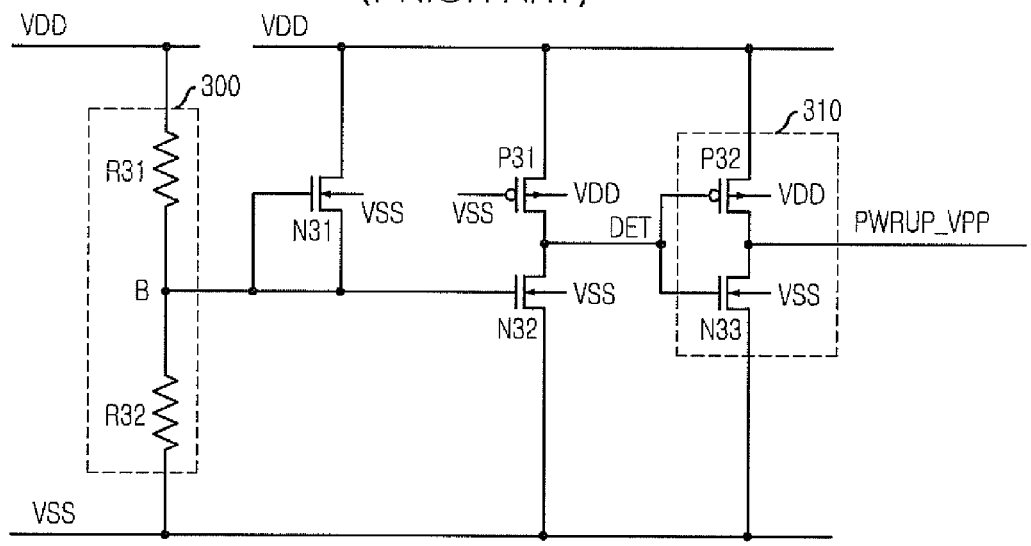
FIG. 3 is a circuit diagram of the power-up signal generating unit for a pumping voltage in FIG. 1.
Figure 4:
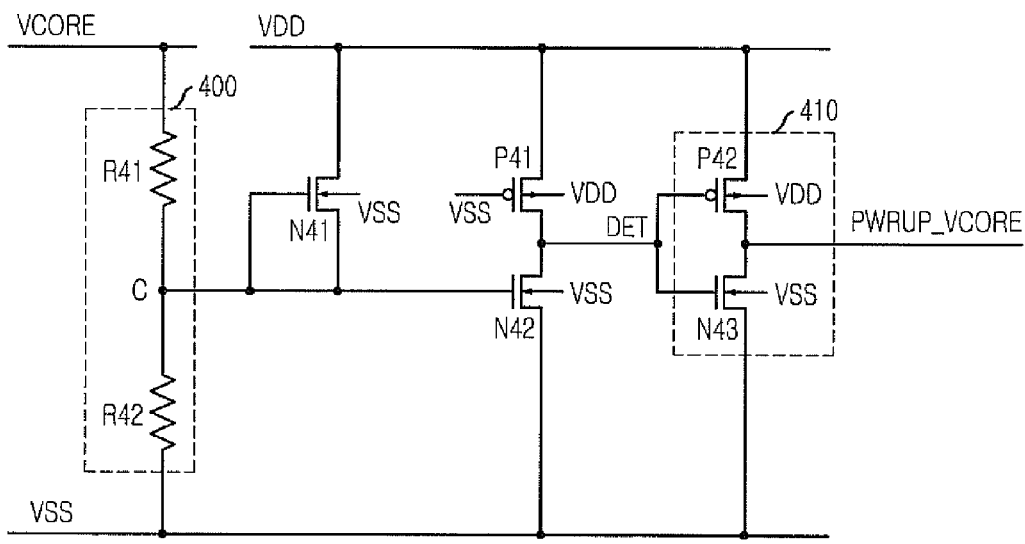
FIG. 4 is a circuit diagram of the power-up signal generating unit for a core voltage in FIG. 1.
Figure 5:
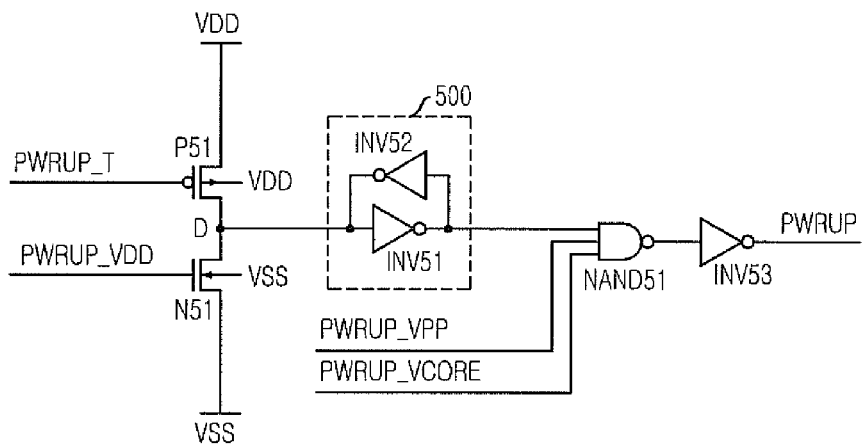
FIG. 5 is a circuit diagram of a final power-up signal generating unit in FIG. 1.

Stabilization power-up signal generating unit 600, precharge power-up signal generating unit 610, external voltage power-up signal generating unit 620, a pumping voltage generating unit 630, core voltage generating unit 640, pumping voltage power-up signal generating unit 650 and core voltage power-up signal generating unit 660 are of substantially the same implementation as the elements in FIG. 1. However, FIG. 6 additionally includes a multiplexing unit 670 and final power-up signal generating unit 680 is different from the final power-up signal generating unit of FIG. 1 with respect to input signal signals applied thereto.

Referring to FIG. 6, the multiplexing unit 670 outputs a first output signal PWRUP_VPP_SEL in response to a pumping voltage off signal TVPPOFF to turn off the pumping voltage generating unit 630 at the test mode and a second output signal PWRUP_VCORE_SEL in response to a core voltage off signal TVCOREOFF to turn off the core voltage generating unit 640 at the test mode.

The final power-up signal generating unit 680 receives a stabilization power-up signal PWRUP_T, an external voltage power-up signal PWRUP_VDD, a pumping voltage power-up signal PWRUP_VPP and a core voltage power-up signal PWRUP_VCORE and produces a final power-up signal PWRUP.

Figure 7:
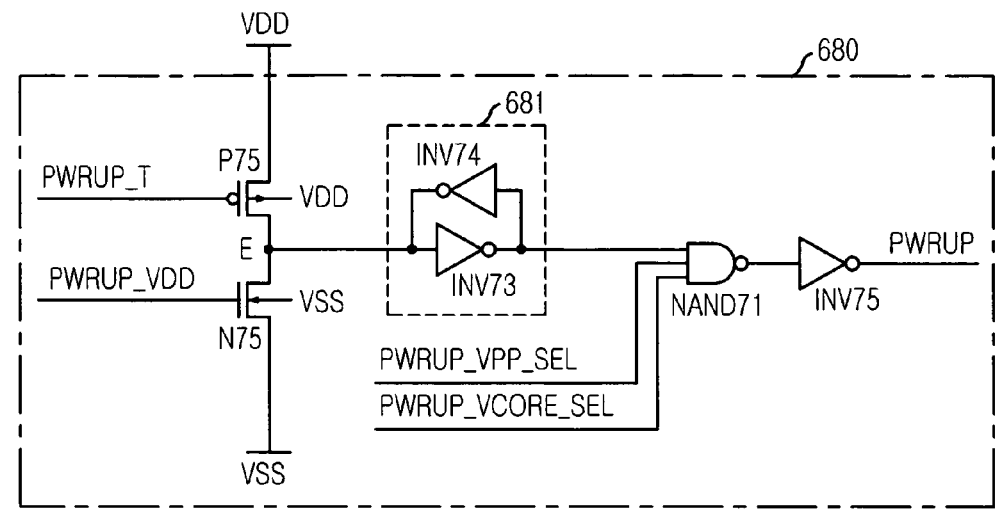
FIG. 7 is a circuit diagram of a multiplexing unit and a final power-up signal generating unit in FIG. 6.
Figure 7:
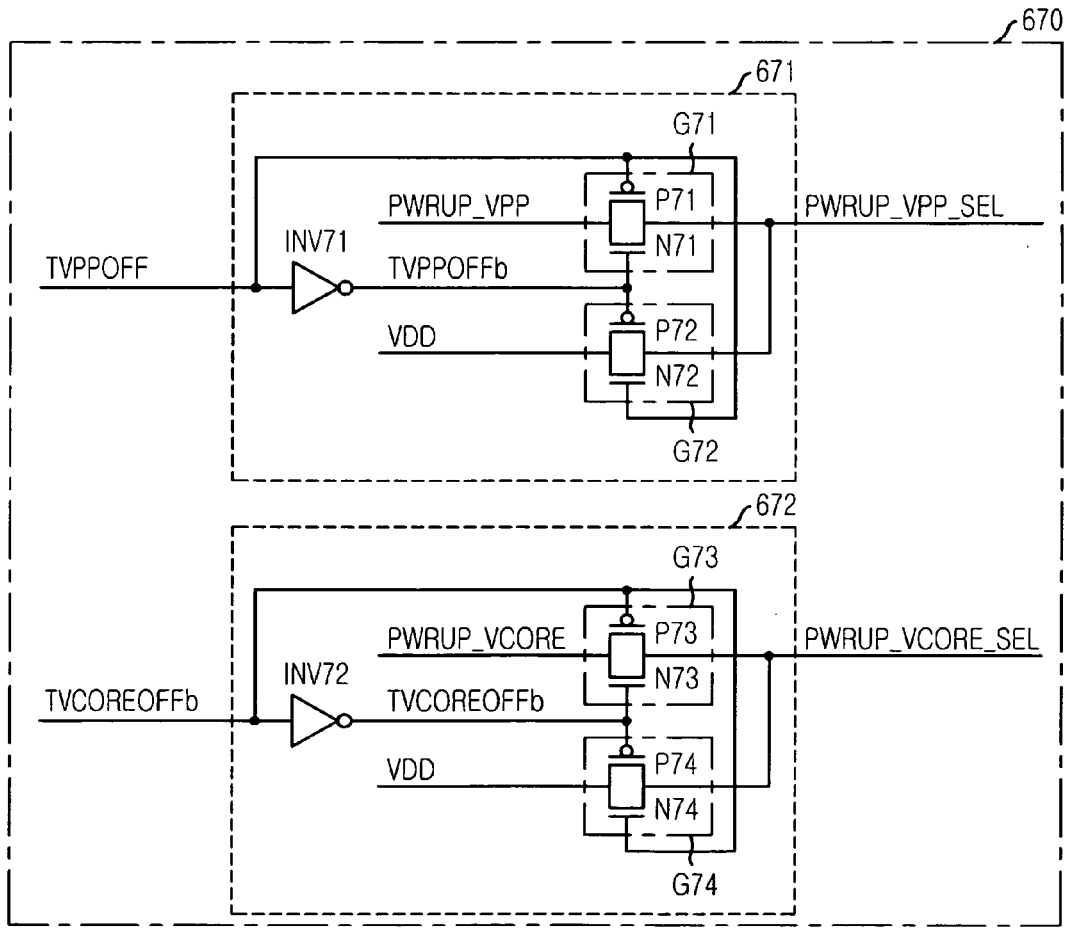

FIG. 7 is a circuit diagram of the multiplexing unit 670 and the final power-up signal generating unit 680 of FIG. 6.

Referring to FIG. 7, the final power-up signal generating unit 680 includes a PMOS transistor P75, an NMOS transistor N75, a latch unit 681, a NAND gate NAND71 and an inverter INV75. The PMOS transistor P75 is disposed between a power supply terminal to receive an external power voltage VDD and node "E" and has a gate to which the stabilization power-up signal PWRUP_T is applied. The NMOS transistor N75 is disposed between node "E" and a ground voltage terminal and has a gate to which an external voltage power-up signal PWRUP_VDD is applied. The latch unit 681 having two inverters INV73 and INV74 receives the voltage on node "E" and temporarily stores the latched voltage. The NAND gate NAND71 receives an output signal of the latch unit 500 and the first and second output signals PWRUP_VPP_SEL and PWRUP_VCORE_SEL and performs the NAND operation of the received signals. The inverter INV75 inverts an output signal of the NAND gate NAND71 to output the final power-up signal PWRUP.

Since the circuit operation of the final power-up signal generating unit 680 is substantially the same as the known final power-up signal generating unit, the detailed description will be omitted. Operation of the multiplexing unit 670 to output the first and second output signals PWRUP_VPP_SEL and PWRUP_VCORE_SEL will be described in detail.

The multiplexing unit 670 includes a first multiplexer 671, which receives the pumping voltage off signal TVPPOFF to turn off the pumping voltage generating unit 630 at the test mode and selectively produces the first output signal PWRUP_VPP_SEL, and a second multiplexer 672, which receives the core voltage off signal TVCOREOFF to turn off the core voltage generating unit 640 at the test mode and selectively produces the second output signal PWRUP_VCORE_SEL.

The first multiplexing unit 671 includes an inverter INV71 to invert the received pumping voltage off signal TVPPOFF for outputting an inverted signal TVPPOFFb of the pumping voltage off signal TVPPOFF, a first transfer gate G71 for transferring the pumping voltage power-up signal PWRUP_VPP in response to the pumping voltage off signal TVPPOFF and the inverted signal TVPPOFFb, and a second transfer gate G72 for transferring the external voltage VDD in response to the pumping voltage off signal TVPPOFF and the inverted signal TVPPOFFb. The external voltage VDD delivered through the second transfer gate G72 can be alternated with other signals which have a predetermined voltage level regardless of the operation mode.

The first transfer gate G71 of the first multiplexing unit 671 includes a PMOS transistor P71 having a gate to which the pumping voltage off signal TVPPOFF is applied and an NMOS transistor N71 having a gate to which the inverted signal TVPPOFFb from the inverter INV71 is applied, wherein the PMOS transistor P71 and the NMOS transistor N71 are disposed in the same source-drain path. Similar to the first transfer gate G71, the second transfer gate G72 of the first multiplexing unit 671 includes a PMOS transistor P72 having a gate to which the inverted signal TVPPOFFb from the inverter INV71 is applied and an NMOS transistor N72 having a gate to which the pumping voltage off signal TVPPOFF is applied, wherein the PMOS transistor P72 and the NMOS transistor N72 are also disposed in the same source-drain path.

The second multiplexing unit 672 includes an inverter INV72 to invert the received core voltage off signal TVCOREOFF for outputting an inverted signal TVCOREOFFb of the core voltage off signal TVCOREOFF, a third transfer gate G73 for transferring the core voltage power-up signal PWRUP_VCORE in response to the core voltage off signal TVCOREOFF and the inverted signal TVCOREOFFb, and a fourth transfer gate G74 for transferring the external voltage VDD in response to the core voltage off signal TVCOREOFF and the inverted signal TVCOREOFFb. The external voltage VDD delivered through the fourth transfer gate G74 can be alternated with other signals which have a predetermined voltage level regardless of the operation mode.

The third transfer gate G73 of the second multiplexing unit 672 includes a PMOS transistor P73 having a gate to which the core voltage off signal TVCOREOFF is applied and an NMOS transistor N73 having a gate to which the inverted signal TVPPOFFb from the inverter INV72 is applied. Further, the fourth transfer gate G74 of the second multiplexing unit 672 includes a PMOS transistor P74 having a gate to which the inverted signal TVPPOFFb from the inverter INV72 is applied and an NMOS transistor N74 having a gate to which the core voltage off signal TVCOREOFF is applied, wherein the PMOS transistor P74 and the NMOS transistor N74 are also disposed in the same source-drain path.

The first and second multiplexing units 671 and 672 correspond to the pumping voltage VPP and core voltage VCORE, respectively. If another internal power supply voltage is required, an additional multiplexing unit can be provided.

When the pumping voltage off signal TVPPOFF is in a logic low level (that is, in the case where the pumping voltage generating unit 630 in FIG. 6 operates), the first transfer gate G71 of the first multiplexing unit 671 is enabled so that the pumping voltage power-up signal PWRUP_VPP is delivered as the first output signal PWRUP_VPP_SEL. When the core voltage off signal TVCOREOFF is in a logic low level (that is, in the case where the core voltage generating unit 640 in FIG. 6 operates), the third transfer gate G73 of the second multiplexing unit 672 is enabled so that the core voltage power-up signal PWRUP_VCORE is delivered as the second output signal PWRUP_VCORE_SEL.

When the pumping voltage off signal TVPPOFF is in a logic high level (that is, in the case where the pumping voltage generating unit 630 in FIG. 6 turned off), the second transfer gate G72 of the first multiplexing unit 671 is enabled so that the external voltage VDD is delivered as the first output signal PWRUP_VPP_SEL. When the core voltage off signal TVCOREOFF is in a logic high level (that is, in the case where the core voltage generating unit 640 in FIG. 6 turned off), the fourth transfer gate G74 of the second multiplexing unit 672 is enabled so that the external voltage VDD is delivered as the second output signal PWRUP_VCORE_SEL.

The power-up signal generating unit according to the present invention outputs the first and second output signals PWRUP_VPP_SEL and PWRUP_VCORE_SEL through the multiplexing unit 670 at the test mode by turning off the pumping voltage generating unit 630 and the core voltage generating unit 640 even if the pumping voltage power-up signal PWRUP_VPP and the core voltage power-up signal PWRUP_VCORE are in a logic low level. Therefore, the final power-up signal PWRUP, which is output by the final power-up signal generating unit 680 in the test time, is maintained in a logic high level.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
    an internal power voltage generation means for producing an internal power voltage using an external power voltage under a control of a test mode internal power off signal to disable an internal power at a test mode;
    a plurality of individual power-up signal generation means for detecting a voltage levels of the external power voltage and a voltage level of the internal power voltage and for producing an individual power-up signals corresponding to the external power voltage detection and an individual power-up signal corresponding to the internal power voltage detection;
    a multiplexing means for, in response to the test mode internal power off signal, selecting one of the individual power-up signals corresponding to the internal power voltage detection and an alternate signal and outputting the selected one as an output signal of the multiplexing means; and
    a final power-up signal generating means for producing a final power-up signal in response to the individual power-up signal corresponding to the internal power voltage detection and the output signal of the multiplexing means.

2. The semiconductor device in accordance with claim 1, wherein the internal power voltage generation means includes a plurality of voltage generators and wherein each of the voltage generators has a corresponding test mode internal power off signal.

3. The semiconductor device in accordance with claim 1, wherein the multiplexing means includes:
    an inverter for inverting the test mode internal power off signal;
    a first transfer gate for delivering the individual power-up signal corresponding to the internal power voltage detection in response to an output signal of an inverter and the test mode internal power off signal in a normal mode; and
    a second transfer gate for delivering the alternate signal in response to an output signal of the inverter and the test mode internal power off signal in the test mode.

4. The semiconductor device in accordance with claim 1, wherein at least one power-up signal produced by the plurality of individual power-up signal generation means is a stabilization power-up signal for a stabilization operation of the semiconductor device.

5. The semiconductor device in accordance with claim 4, wherein the final power-up signal generating means includes:
    an NMOS transistor disposed between a node and a ground voltage terminal and having a gate to which the individual power-up signal corresponding to the external power voltage detection is applied;
    a PMOS transistor disposed between the node and an external power voltage terminal and having a gate to which the stabilization power-up signal is applied;
    a latch unit for latching a voltage level on the node; and
    an output unit receiving an output signal of the latch unit and the output signal of the multiplexing means for outputting the final power-up signal.

6. The semiconductor device in accordance with claim 5, wherein the latch unit includes:
    a first inverter connected to the node; and
    a second inverter having an input terminal connected to an output terminal of the first inverter and an output terminal connected to an input terminal of the first inverter.

7. The semiconductor device in accordance with claim 5, wherein the output unit includes:
    a NAND gate for NANDing the output signal of the latch unit and the output signal of the multiplexing means; and
    an inverter for inverting an output signal of the NAND gate to output an inverted signal as the power-up signal.

8. The semiconductor device in accordance with claim 1, wherein
    the internal power voltage generation means produces a second internal power voltage using the external power voltage, the plurality of individual power-up signal generation means detects a voltage level of the second internal power voltage and produces an individual power-up signal corresponding to the second internal power voltage detection, and
    the multiplexing means outputs a second output signal of the multiplexing means by, while outputting the first output signal of the multiplexing means, selecting one of the individual power-up signal corresponding to the second internal power voltage detection and the alternate signal and outputting the selected one as the second output signal of the multiplexing means.

* * * * *